United States Patent
Park et al.

(10) Patent No.: US 10,400,979 B2
(45) Date of Patent: Sep. 3, 2019

(54) VEHICLE LAMP USING SEMICONDUCTOR LIGHT EMITTING DEVICE

(71) Applicant: LG ELECTRONICS INC., Seoul (KR)

(72) Inventors: Sechul Park, Seoul (KR); Mingu Kang, Seoul (KR); Hooyoung Song, Seoul (KR); Sungwhan Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 145 days.

(21) Appl. No.: 15/498,956

(22) Filed: Apr. 27, 2017

(65) Prior Publication Data

US 2018/0313513 A1    Nov. 1, 2018

(51) Int. Cl.
| | | |
|---|---|---|
| *B60Q 1/06* | (2006.01) | |
| *B60Q 1/20* | (2006.01) | |
| *B60Q 1/26* | (2006.01) | |
| *B60Q 1/44* | (2006.01) | |
| *F21S 43/14* | (2018.01) | |
| *F21S 43/19* | (2018.01) | |
| *H01L 33/00* | (2010.01) | |

(52) U.S. Cl.
CPC ............ *F21S 43/195* (2018.01); *B60Q 1/06* (2013.01); *B60Q 1/20* (2013.01); *B60Q 1/2607* (2013.01); *B60Q 1/2696* (2013.01); *B60Q 1/44* (2013.01); *F21S 43/14* (2018.01); *H01L 33/00* (2013.01)

(58) Field of Classification Search
CPC ......... F21S 41/143; F21S 41/141; F21S 41/14
See application file for complete search history.

(56) References Cited

U.S. PATENT DOCUMENTS

| 9,883,558 B2 * | 1/2018 | Xiong ................ F21V 3/061 |
| 2005/0248935 A1 * | 11/2005 | Strip .................. G06F 1/1601 362/145 |
| 2012/0075871 A1 * | 3/2012 | Chen .................. F21S 2/005 362/362 |
| 2013/0322082 A1 * | 12/2013 | Hollander ............ F21S 2/005 362/249.02 |
| 2014/0062316 A1 * | 3/2014 | Tischler ............. H05B 33/0821 315/185 R |
| 2014/0226329 A1 * | 8/2014 | Oraw ................. H01L 25/0753 362/235 |

(Continued)

*Primary Examiner* — Alexander K Garlen
*Assistant Examiner* — Colin J Cattanach
(74) *Attorney, Agent, or Firm* — Birch, Stewart, Kolasch & Birch, LLP

(57) ABSTRACT

A vehicle lamp includes a plurality of light emitting modules electrically connected together. Each of the light emitting modules includes a wiring board, a plurality of semiconductor light emitting devices arranged on one surface of the wiring board, a first wiring electrically connected to first conductive electrodes of the semiconductor light emitting devices and arranged on the one surface of the wiring board, and a second wiring electrically connected to second conductive electrodes of the semiconductor light emitting devices and extending to another surface of the wiring board through a via hole. The first wiring of at least one of the light emitting modules and the second wiring of the neighboring light source module overlap each other in a thickness direction of the light emitting modules, such that the light emitting modules are connected in series.

14 Claims, 9 Drawing Sheets

(56) References Cited

U.S. PATENT DOCUMENTS

| | | | | |
|---|---|---|---|---|
| 2014/0231793 A1* | 8/2014 | Rajan | ............ | H05K 1/147 257/40 |
| 2015/0267907 A1* | 9/2015 | Thompson | ............ | F21V 23/06 362/249.06 |
| 2015/0308671 A1* | 10/2015 | Tischler | ............ | H01S 5/042 362/235 |
| 2015/0360606 A1* | 12/2015 | Thompson | ............ | B60Q 3/252 362/490 |
| 2016/0154170 A1* | 6/2016 | Thompson | ............ | G02F 1/133603 362/609 |
| 2017/0211761 A1* | 7/2017 | Kuriki | ............ | F21V 29/89 |

* cited by examiner

VEHICLE LAMP USING SEMICONDUCTOR LIGHT EMITTING DEVICE

BACKGROUND OF THE INVENTION

1. Field of the Invention

The present invention relates to a vehicle lamp (or car lamp), and more particularly, a vehicle lamp using a semiconductor light emitting device.

2. Description of the Conventional Art

A vehicle is equipped with various lamps having lighting functions and signaling functions. In general, halogen lamps or gas discharge lamps are usually used, but in recent years, light emitting diodes (LEDs) are in the spotlight as light sources for vehicle lamps.

The LED can enhance a degree of freedom for design of a lamp by minimizing a size thereof and exhibit economic efficiency by virtue of a semi-permanent lifespan, but most of the LEDs are currently produced in a form of a package. The LED itself other than the package is under development as a semiconductor light emitting device of converting a current into light, namely, an image displaying light source equipped in an electronic device such as an information communication device.

Vehicle lamps using the LEDs in the package form have disadvantages such as a low mass production yield rate, high fabrication costs and low flexibility. Therefore, attempts to apply a surface light source using the semiconductor light emitting device itself other than the package type to the vehicle lamp are currently undergoing. However, the surface light source using the semiconductor light emitting device itself has difficulty in implementing a large area as light sources. Thus, the present invention proposes a new mechanism capable of facilitating an implementation of a large surface light source.

SUMMARY OF THE INVENTION

The present invention has been made in an effort to solve the aforementioned problems, and an aspect of the present invention is to provide a vehicle lamp capable of implementing a large surface light source using a semiconductor light emitting device.

Another aspect of the detailed description is to provide a surface light source capable of deriving various designs of vehicle lamps.

Another aspect of the detailed description is to provide a tiling mechanism capable of minimizing a gap between light source modules.

A vehicle lamp according to the present invention to achieve those aspects may be configured such that unit surface light sources are tiled, so as to implement a large light source. Here, a stacked structure of the modules for minimizing a gap between the modules is proposed.

In detail, a vehicle lamp according to the present invention may include a plurality of light emitting modules electrically connected together, and each of the light emitting modules may include a wiring board, a plurality of semiconductor light emitting devices arranged on one surface of the wiring board, a first wiring electrically connected to first conductive electrodes of the semiconductor light emitting devices and arranged on the one surface of the wiring board, and a second wiring electrically connected to second conductive electrodes of the semiconductor light emitting devices and extending to another surface of the wiring board through a via hole. The first wiring of at least one of the light emitting modules and the second wiring of the neighboring light source module may overlap each other in a thickness direction of the light emitting modules, such that the light emitting modules are connected in series.

The first wiring of the at least one of the light emitting modules may overlap the second wiring of the neighboring light emitting module on edges of the light emitting modules. The light emitting modules may be arranged such that the edges are sequentially stacked in one direction.

At least first side included in the light emitting modules and a second side of the neighboring light emitting module may be arranged to face each other, or may overlap each other.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings:

FIG. 1B is an enlarged view illustrating a state that the rear lamp of FIG. 1A is turned on;

DETAILED DESCRIPTION OF THE INVENTION

Figure 1A:
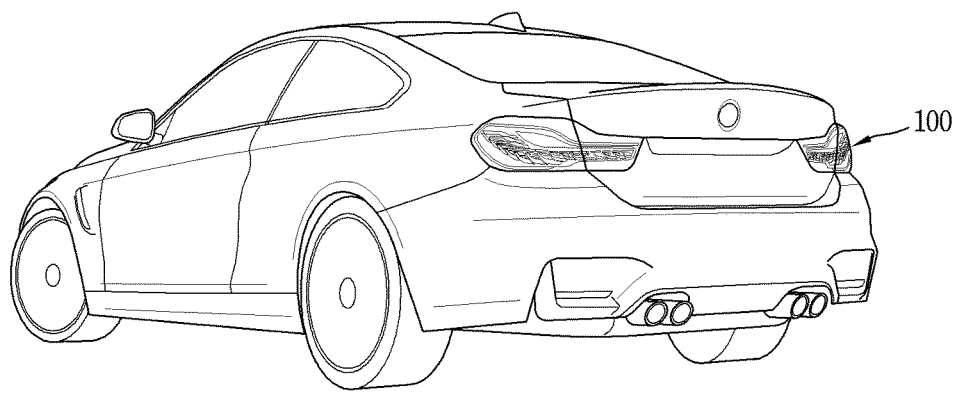
FIG. 1A is a conceptual view illustrating a rear lamp as one embodiment of a vehicle lamp.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. In describing the embodiments disclosed herein, moreover, the detailed description will be omitted when a specific description for publicly known technologies to which the invention pertains is judged to obscure the gist of the present invention.

Also, the accompanying drawings are merely illustrated to easily explain the concept of the invention, and therefore, they should not be construed to limit the technological concept disclosed herein by the accompanying drawings. Furthermore, when an element such as a layer, region or substrate is referred to as being "on" another element, it can be directly on the other element or an intermediate element may also be interposed therebetween.

A vehicle lamp described in this specification may include a head lamp, a tail lamp, a position lamp, a fog lamp, a turn signal lamp, a brake lamp, an emergency lamp, a backup lamp, and the like. However, it will be readily apparent to those skilled in the art that the configuration according to the embodiments described herein may also be applied to a new product type that will be developed later if the device is a device capable of emitting light.

Figure 1B:
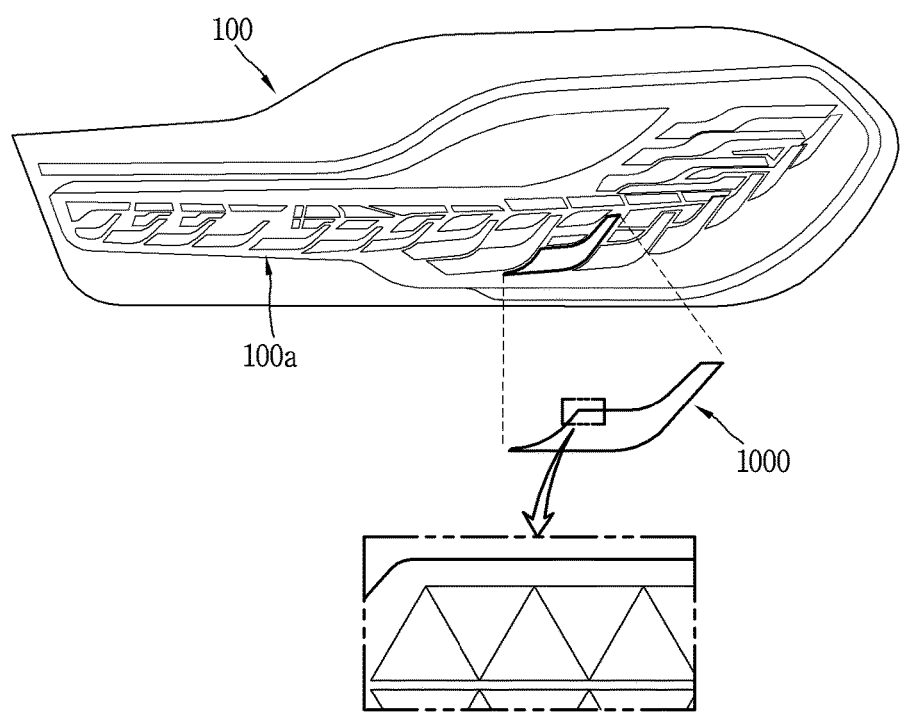

FIG. 1A is a conceptual view illustrating a rear lamp as one embodiment of a vehicle lamp, and FIG. 1B is an enlarged view illustrating a state in which the rear lamp of FIG. 1A is turned on.

Referring to FIG. 1A, a rear lamp 100 of a vehicle is disposed on each of both sides of a rear surface of the vehicle, thereby forming rear appearance of the vehicle.

The rear lamp 100 may be a lamp in which a tail lamp, a turn signal lamp, a brake lamp, an emergency lamp, and a backup lamp are combined in a package form. That is, the rear lamp 100 includes a plurality of lamps selectively emitting light according to the control of the vehicle.

In this instance, at least one of the plurality of lamps may be configured to emit light in a preset shape. As one example, a brake lamp 100a may be formed long in a horizontal direction and have at least part curved in a vertical direction, such that light is emitted in a shape corresponding to the shape of the brake lamp 100a. In addition, the brake lamp 100a may be bent toward the front of the vehicle. Such three-dimensional complex shape may be realized by a plurality of light emitting regions.

Referring to FIG. 1B, the preset shape is realized by combining light emitting regions with different shapes.

A light source unit 1000 implemented by a semiconductor light emitting device may be disposed on the light emitting region. The light source unit 1000 may be fixed to a vehicle body through a frame, and a wiring line for supplying power to the light source unit 1000 may be connected to the frame.

The light source unit may be a flexible light source unit that can be curved, bent, twisted, folded or rolled by an external force. The light source unit may also be a surface light source having a light emitting surface corresponding to the light emitting region.

In this instance, the light source unit 1000 may be provided in plurality to be arranged on the light emitting regions, respectively, or be configured as a single light emitting unit so as to realize the entire preset shape.

A pixel of the light source unit 1000 may be implemented by a semiconductor light emitting device. In the present invention, a light emitting diode (LED) is exemplarily employed as one type of semiconductor light emitting device for converting a current into light. The LED may be a light emitting device having a size ranging from several to several tens of micrometers, and may serve as a pixel on the three-dimensional space.

Meanwhile, the light source unit according to the present invention is configured so that light source modules are tiled, thereby realizing a light source with a large area. Hereinafter, light source units formed to be tiled will be described in more detail.

Figure 2:
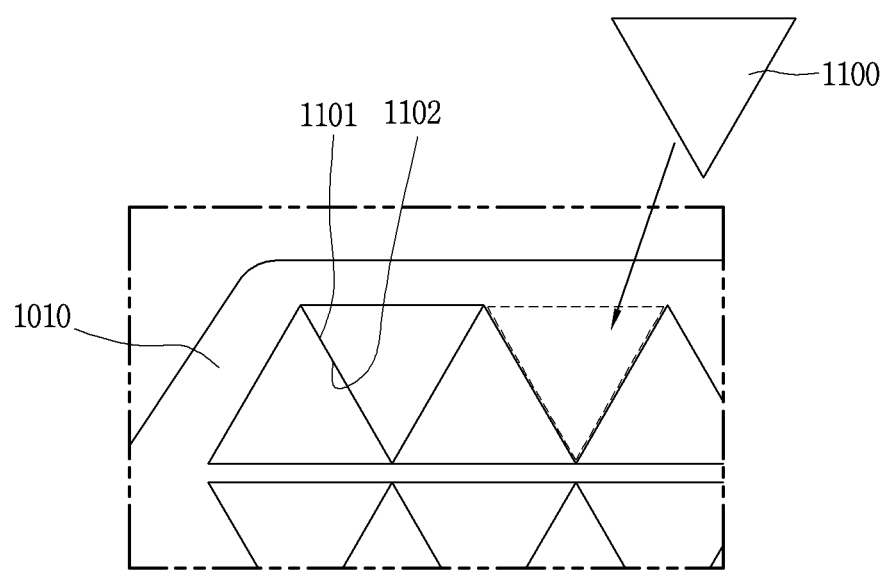
FIG. 2 is a conceptual view illustrating a basic concept of tiling light source modules.
Figure 3:
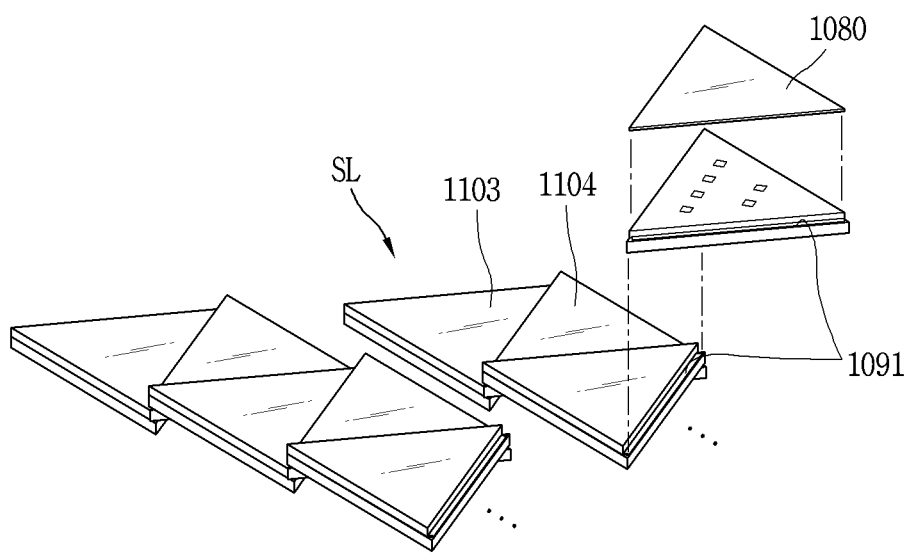
FIG. 3 is a perspective view of a light source unit in accordance with one embodiment of the present invention.
Figure 4:
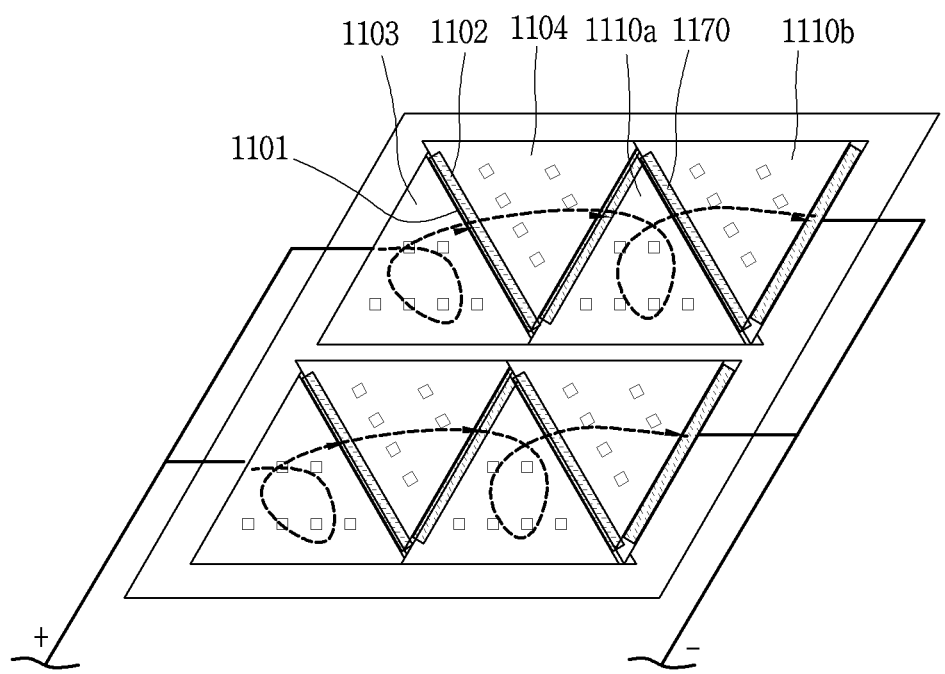
FIG. 4 is a planar view of the light source unit of FIG. 3.
Figure 5A:
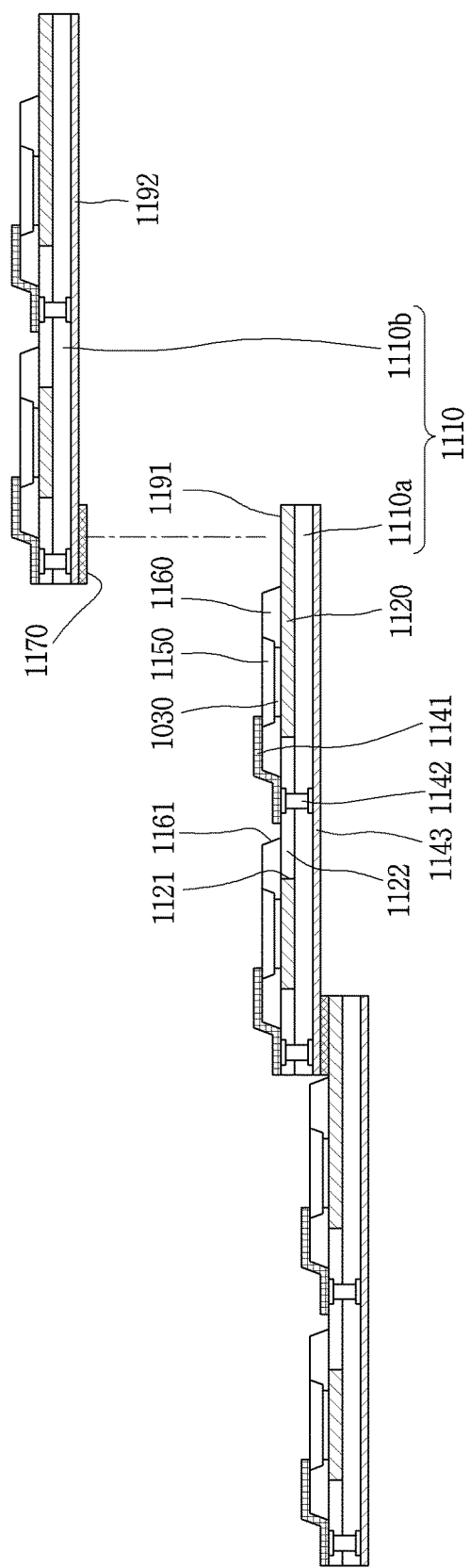
FIG. 5A and FIG. 5B is a cross-sectional view of the light source unit of FIG. 3.
Figure 5B:
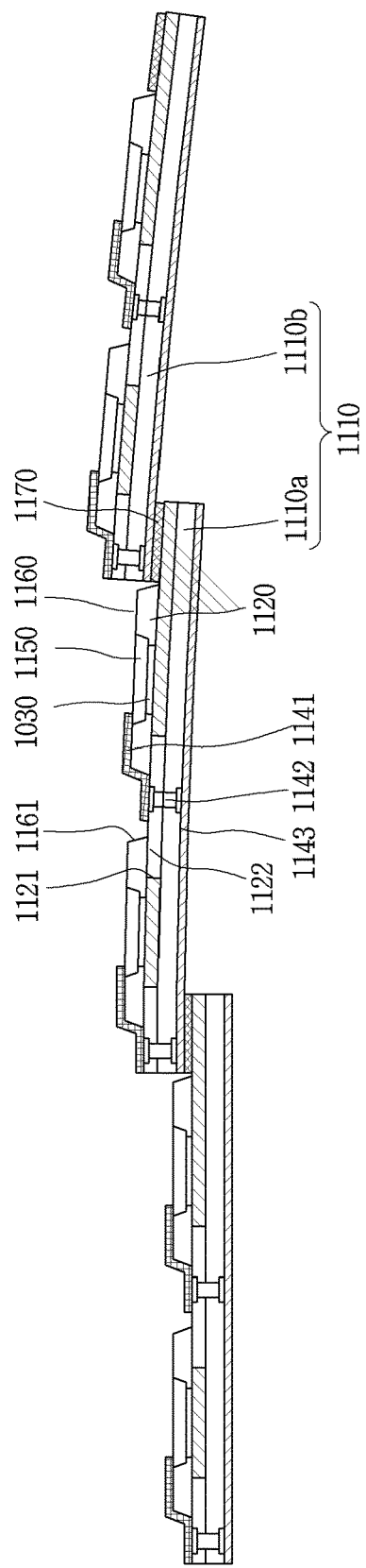
Figure 6:
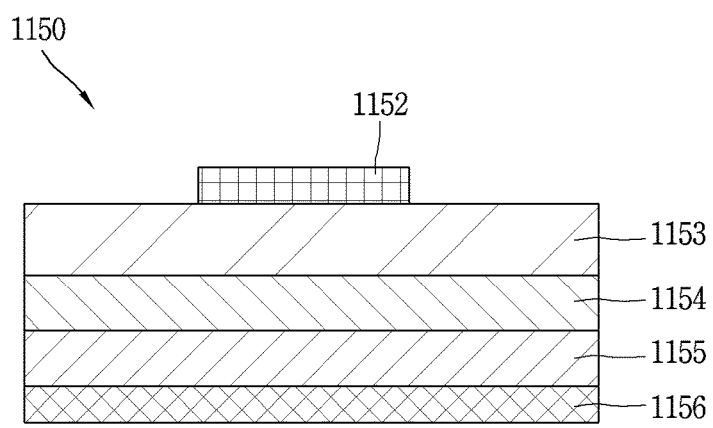
FIG. 6 is a conceptual view illustrating a vertical semiconductor light source unit of FIG. 3.

FIG. 2 is a conceptual view illustrating a basic concept of tiling light source modules, FIG. 3 is a perspective view of a light source unit according to one embodiment of the present invention, FIG. 4 is a planar view of the light source unit of FIG. 3, FIG. 5A and FIG. 5B is a cross-sectional view of the light source unit of FIG. 3, and FIG. 6 is a conceptual view illustrating a vertical semiconductor light source unit of FIG. 3.

Referring to FIG. 2, a light source unit 1000 includes a base portion 1010 and a plurality of light source modules 1100.

The base portion 1010 is a substrate on which the plurality of light source modules 1100 are attached, and may be a base layer whose structure is formed through an entire process. In this instance, the base portion 1010 may include a reflective film for reflecting light. The reflective film reflects light emitted from the light source modules 1100, and thus the base portion 1010 may be a reflector of a lamp. In order to realize a three-dimensional shape of a rear lamp, the base portion 1010 may be formed in a shape with at least part curved (or bent).

The base portion 1010 may contain glass or polyimide (PI) to implement a flexible light source unit. Further, the base portion 1010 may be a thin metal.

The plurality of light source modules 1100 are arranged on one surface of the base portion 1010. In this instance, a heat dissipation sheet, a heat sink, or the like is mounted on the base portion 1010, and a heat dissipation function can be realized accordingly. In this case, the heat dissipation sheet, the heat sink, or the like may be mounted on an opposite surface of the one surface on which the plurality of light source modules 1100 are disposed.

The plurality of light source modules 1100 may be formed in a polygonal shape and continuously attached on the surface of the base portion 1010. The plurality of light source modules 1100 may have various shapes such as a quadrangle, a triangle, a hexagon and the like. This embodiment exemplarily illustrates a triangular light source module in consideration of design freedom. As such, since triangular unit light source modules 1100 are arranged on the surface of the base portion 1010, a surface light source (or planar light source) in desired size and shape can be realized.

In this instance, at least first (one) side 1101 included in the light source modules 1100 may be disposed to face a second side 1102 of a neighboring light source module. For example, the light source modules 1100 may be arranged so that triangles and inverted triangles are repeated along one direction. More specifically, the light source modules 1100 may form a parallelogram in a manner that the triangles and the inverted triangles are sequentially arranged in a row direction. The arrangement pattern of the light source modules 1100 may be varied into various forms, which will be described later.

Meanwhile, in the present invention, a large surface light source with an invisible joint can be implemented by minimizing a gap (bezel) between unit surface light sources which may be generated when arranging the light source modules 1100. Hereinafter, a tiling mechanism capable of minimizing the gap between the light source modules will be described in more detail.

Referring to FIGS. 3 to 5B, each of the light source modules 1100 includes a wiring board 1110, a first wiring 1120, an adhesive layer 1130, a second wiring 1140, and a plurality of semiconductor light emitting devices 1150.

The wiring board 1110 may be a flexible board. For example, the wiring board 1110 may contain glass or polyimide (PI) to realize a flexible light source unit. In addition, the wiring board 110 may be made of any material such as polyethylene naphthalate (PEN) or polyethylene terephthalate (PET) if the material has an insulating property and flexibility. Also, the wiring board 1110 may be made of any of a transparent material or an opaque material.

At least one of the first wiring 1120 and the second wiring 1140 may be provided with a surface electrode. As an example, a first surface electrode may be provided on one surface of the wiring board 1110, and a second surface electrode 1143 may be provided on another surface of the wiring board 1110.

For example, the first wiring 1120 may be located on one surface of the wiring board 1110 and formed as a planar or surface electrode. The first wiring 1120 may be an electrode layer disposed on the wiring board 1110, and serve as a data electrode. As another example, the first wiring 1120 may be formed as a bar-shaped electrode long in one direction.

The first wiring 1120 in the planar shape is the first surface electrode, and may be a common electrode surface that covers the plurality of semiconductor light emitting devices 1150 such that light can be reflected between the plurality of semiconductor light emitting devices 1150. Accordingly, a structure of a highly-reflective electrode layer can be realized, thereby enhancing light efficiency. The surface electrode may overlap 10 to 100,000 semiconductor light emitting devices, and the semiconductor light emitting devices 1150 cover the surface electrode in an array form.

A conductive layer 1030 may be a portion that is soldered by a solder material. The solder material may be at least one of, for example, Sb, Pd, Ag, Au and Bi. In this instance, the solder material is coated on the first wiring 1120 of the wiring board, and soldering may be performed using thermal energy. As another method, the solder material may be coated on the semiconductor light emitting device, and soldering may be performed using thermal energy.

As such, the semiconductor light emitting device 1150 is connected to the first wiring 1120 through the conductive layer 1030 and constitutes an individual pixel in the light source module 1100. The semiconductor light emitting device 1150 even in a small size can constitute an individual unit pixel by virtue of its excellent brightness. The size of the individual semiconductor light emitting device 1150 may be 80 μm or less on one side and may be a rectangular or square device. In the case of having the rectangular shape, the size of the individual semiconductor light emitting device 1150 may be 20×80 μm or less.

In this instance, an insulating layer 1160 may be coated on one surface of the wiring board to fill a space between the semiconductor light emitting devices.

As illustrated, at least part of the second wiring 1040 may be located on the insulating layer 1160. The second wiring 1040 may be electrically connected to the semiconductor light emitting devices 1050 in a contact manner.

As another example, the conductive layer 1030 may be a layer having adhesiveness and conductivity. To this end, the conductive layer 1030 may be configured by mixing a material having conductivity and a material having adhesiveness. The conductive layer 1030 also has flexibility, thereby enabling a flexible function in a display device.

As an example, the conductive layer 1030 may be an anisotropic conductive film (ACF), an anisotropic conductive paste, a solution containing conductive particles, or the like. The conductive layer 1030 may be formed as a layer which allows an electrical interconnection in a Z direction penetrating through thickness but has an electrical insulating property in a horizontal X-Y direction. Accordingly, the conductive layer 1030 may be referred to as a Z-axial conductive layer.

The anisotropic conductive film is a film in which an anisotropic conductive medium is mixed with an insulating base member. When heat and pressure are applied, only a specific portion of the anisotropic conductive film has conductivity due to the anisotropic conductive medium. Hereinafter, description will be given of an example in which heat and pressure are applied to the anisotropic conductive film, but other methods may be used to allow the anisotropic conductive film to partially have conductivity. Examples of these methods may be a method of applying one of the heat and the pressure, UV curing, and the like.

In addition, since the anisotropic conductive film contains an adhesive component, the conductive layer 1030 realizes not only an electrical connection but also mechanical bonding between the semiconductor light emitting device 1150 and the first wiring 1120.

In this instance, the anisotropic conductive medium may be, for example, conductive balls or conductive particles. In this example, the anisotropic conductive film is a film in which conductive balls are mixed with an insulating base member. When heat and pressure are applied, only a specific portion of the anisotropic conductive film has conductivity by the conductive balls. The anisotropic conductive film may be in a state in which a plurality of particles coated with an insulating film made of a polymer material are contained in a conductive core. In this instance, the insulating film on the heat and pressure-applied portion is broken and thus the anisotropic conductive film has the conductivity due to the core. In this instance, a shape of the core may be deformed to form layers brought into contact with each other in a thickness direction of the film. As a more specific example, heat and pressure are applied to the full anisotropic conductive film, and the electrical connection in the Z-axial direction is partially formed by a height difference of a member adhered by the anisotropic conductive film.

As such, the semiconductor light emitting device 1150 is connected to the first wiring 1120 through the adhesive layer 1130 and constitutes an individual pixel in the light source module 1100. The semiconductor light emitting device 1150 even in a small size can constitute an individual unit pixel by virtue of its excellent brightness. The size of the individual semiconductor light emitting device 1150 may be 80 μm or less on one side and may be a rectangular or square device. In the case of having the rectangular shape, the size of the individual semiconductor light emitting device 1150 may be 20×80 μm or less.

As illustrated, the semiconductor light emitting device 1150 may have a vertical structure. However, the present invention is not limited thereto, and the semiconductor light emitting device may alternatively be a flip chip type light emitting device.

Referring to FIG. 6, the vertical semiconductor light emitting device includes a p-type electrode 1156, a p-type semiconductor layer 1155 disposed on the p-type electrode 1156, an active layer 1154 disposed on the p-type semiconductor layer 1155, an n-type semiconductor layer 1153 disposed on the active layer 1154, and an n-type electrode 1152 disposed on the n-type semiconductor layer 1153. In this instance, the p-type electrode 1156 located at the bottom may be electrically connected to the first wiring 1120 by the adhesive layer 1130, and the n-type electrode 1152 located at the top may be electrically connected to the second wiring 1140. The vertical type semiconductor light emitting device 1150 may have the electrodes arranged at the top and bottom, so as to have a great advantage of reducing a chip size.

The n-type electrode 1152 and the p-type electrode 1156 may be formed by a deposition method such as sputtering, but the present invention is not limited thereto. In this instance, the n-type electrode 1152 may be a second conductive electrode, and the p-type electrode 1156 may be a first conductive electrode. The p-type semiconductor layer may be a first conductive semiconductor layer, and the n-type semiconductor layer may be a second conductive semiconductor layer.

According to another embodiment of the present invention, impurities may be injected into an intrinsic or doped semiconductor substrate to form the first and second conductive semiconductor layers. In addition, a region where a p-n junction is formed by the impurity injection may serve as the active layer. Therefore, the following description of the p-type semiconductor layer, the n-type semiconductor layer and the active layer is merely exemplary and the present invention is not limited thereto.

Referring back to FIGS. 3 to 5B, the second wiring 1140 may be electrically connected to the semiconductor light emitting devices 1150 and disposed on another surface of the wiring board.

As illustrated, the second wiring 1140 may be provided with a connection electrode 1141, a via hole 1142, and a surface electrode 1143. For example, the semiconductor light emitting device 1150 may extend to the via hole 1142, which is formed on one surface of the wiring board, by the connection electrode 1141, and the via hole 1142 may be electrically connected to the surface electrode 1143 disposed on the another surface of the wiring board. The another surface is opposite to the one surface of the wiring board 1110 having the first wiring, namely, may be a lower surface of the wiring board 1110. Therefore, the one surface of the wiring board 1110 may be an upper surface of the wiring board 1110. Therefore, the surface electrode may be disposed on the lower surface of the wiring board 1110 and correspond to the aforementioned second surface electrode 1143.

In this instance, the connection electrode 1141 itself may be the n-type electrode 1152 of the semiconductor light emitting device 1150. For example, the n-type electrode 1152 may be formed as an ohmic electrode for an ohmic contact, and cover at least a part of the via hole 1142 in a printing manner or a deposition manner. Accordingly, the surface electrode 1143 of the second wiring 1140 and the n-type electrode 1152 of the semiconductor light emitting device 1150 can be electrically connected to each other.

Meanwhile, the plurality of semiconductor light emitting devices 1150 included in the light source module 1100 are connected in parallel in the light source module 1100.

For example, the plurality of semiconductor light emitting devices 1150 are connected in parallel by the first wiring 1120 and the second wiring 1140. Specifically, one of the p-type electrode and the n-type electrode included in each of the plurality of semiconductor light emitting devices is connected to the first wiring 1120, and the other of the p-type electrode and the n-type electrode is connected to the second wiring 1140. As an example, the first wiring 1120 may be connected to the p-type electrodes 1156 of the plurality of semiconductor light emitting devices, and the second wiring 1140 may be connected to the n-type electrodes 1152 of the plurality of semiconductor light emitting devices.

In this instance, the first wiring and the second wiring form common electrodes, respectively. In detail, the plurality of semiconductor light emitting devices are connected in parallel to the first wiring and the second wiring to have the first wiring 1120 and the second wiring 1140 as the common electrodes, respectively. Accordingly, a loss of function of the entire system due to an electrical disconnection in the light source module 1100 can be prevented, and a uniform current distribution can be obtained.

The plurality of semiconductor light emitting devices 1150 also construct a light emitting device array, and the insulating layer 1160 is interposed between the plurality of semiconductor light emitting devices 1150. For example, the insulating layer 1160 is formed on one surface of the adhesive layer 1130 to fill a space between the neighboring semiconductor light emitting devices 1150.

As illustrated, at least part of the second wiring 1140 may be located on the insulating layer 1160. Also, the second wiring 1140 extends from the insulating layer 1160 to the one surface of the wiring board. For example, the connection electrode 1141 may extend from the insulating layer 1160 to the one surface of the wiring board 1110. However, the present invention is not necessarily limited thereto. When the adhesive layer 1130 fills the space between the semiconductor light emitting devices without the insulating layer 1160, the second wiring 1140 may be located on the adhesive layer 1130.

The insulating layer 1160 may be a transparent insulating layer containing silicon oxide ($SiO_x$) or the like. As another example, the insulating layer 1160 may be formed of a polymer material such as epoxy, methyl, or phenyl-based silicone having a good insulating property and less light absorption, or an inorganic material such as SiN or $Al_2O_3$, to construct a structure for preventing electrodes from being shorted from each other.

The insulating layer 1160 may be provided with an insulation through hole 1161 at a position corresponding to the via hole 1142. The first wiring 1120 may also be provided with a wiring through hole 1121 at a position corresponding to the insulation through hole 1161. As an example, the first surface electrode is provided with the wiring through hole 1121 corresponding to the via hole 1142. Here, a wiring insulating layer 1122 filled in am empty space of the wiring through hole 1121 may be separately provided.

As illustrated, the connection electrode 1141 may extend to the wiring insulating layer 1122 through the insulation through hole 1161, and the via hole 1142 may extend up to the wiring insulating layer 1122 to be electrically connected to the connection electrode 1141.

As such, electric anode and cathode can be patterned on both surfaces of the wiring board, respectively, and the through hole may be formed, such that the p-type electrode and the n-type electrode of the semiconductor light emitting device can be electrically isolated from each other on the upper surface of the wiring board.

Meanwhile, a phosphor layer 1180 may be provided on one surface of the semiconductor light emitting device 1150. For example, the semiconductor light emitting device 1150 is a blue semiconductor light emitting device that emits blue (B) light, and a phosphor layer 1180 for converting the blue light into a color of a unit pixel may be provided. In this instance, the phosphor layer 1180 may be a red phosphor that converts blue to red.

As another example, the semiconductor light emitting device 1150 may be a semiconductor light emitting device that emits blue or green light, and the phosphor layer 1180 may be a yellow phosphor that converts blue or green to white. In this instance, the plurality of semiconductor light emitting devices may be realized as high-output light emitting devices which further contain indium (In) and/or aluminum (Al) together with gallium nitride (GaN) and emit light. As one example, the plurality of semiconductor light emitting devices may be gallium nitride thin films formed into various layers such as n-Gan, p-Gan, AlGaN, and InGan.

In this instance, a wavelength of light formed in a nitride-based semiconductor light emitting device is in the range of 390 to 550 nm and may be converted into 450 to 670 nm through a phosphor-inserted film. Further, all of the red phosphor and the green phosphor may be provided such that light of various wavelengths can be mixed to realize white light.

However, the present invention is not limited thereto. The semiconductor light emitting device 1150 may be a red semiconductor light emitting device that emits red (R) light, and the phosphor layer 1180 may be replaced with an encapsulating material.

In this instance, a GaAs-based red semiconductor light emitting device may be used, and an encapsulating layer covering the upper surface of the wiring board 1110 in the light source module 1100 may be provided.

The encapsulating layer is coated on the upper surface of the wiring board 1110 so as to cover the semiconductor light emitting devices 1150 to protect the semiconductor light emitting devices 1150 provided on the wiring board 1110. The encapsulating layer may be made of a thermosetting and/or photocurable resin. The encapsulating layer may be coated on the upper surface of the wiring board 1110 in a liquid state, and then cured by a curing process using heat and/or light.

As another example, a light diffusion film may be used as the encapsulating layer. Further, a scattering agent or the like may be added to the encapsulating layer to improve light extraction efficiency.

Meanwhile, as illustrated, the neighboring light emitting modules may be stacked such that electric anode and cathode are brought into contact each other at edges of the light emitting modules, which may result in implementing the series connection (or serial connection) of the light emitting modules even without a base board.

In more detail, at least one side (first side) included in the light emitting modules is disposed to face one side (second side) of the neighboring light emitting module such that the light emitting modules can be connected in series. In this instance, the first wiring of at least one of the light emitting modules and the second wiring of the neighboring light emitting module may overlap each other in a thickness direction of the light emitting modules. To this end, the at least first side included in the light emitting modules overlaps the second side of the neighboring light emitting module.

More specifically, the first wiring of the at least one of the light emitting modules overlaps the second wiring of the neighboring light emitting module at the edges (sides) of the light emitting modules, and the light emitting modules are arranged such that the edges are sequentially stacked in one direction.

To implement this structure, the insulating layer 1160 is formed such that at least part of the first wiring 1120 is externally exposed at the edge of the light emitting module. For example, the first wiring 1120 is a common electrode surface in a planar shape and the insulating layer 1160 does not cover the common electrode surface at the edge of the light emitting module. A portion of the first wiring 1120 without being covered with the insulating layer 1160 forms a first electrode 1191.

Also, a portion arranged on the edge of the wiring board, of the surface electrode 1143 of the second wiring 1140, may be defined as a second electrode 1192.

As illustrated, the first electrode 1191 and the second electrode 1192 are arranged on first and second sides 1101 and 1102 facing each other such that the light emitting modules 1100 are electrically connected to each other. For example, one of the first electrode 1191 and the second electrode 1192 may be arranged on each side of the light emitting modules 1100, and the first electrode 1191 and the second electrode 1192 may be connected to the p-type electrodes and the n-type electrodes of the plurality of semiconductor light emitting devices, respectively.

However, this connection relationship is merely illustrative, but the present invention is not necessarily limited thereto. For example, the p-type electrode may be connected to the second wiring and the second electrode and the n-type electrode may be connected to the first wiring and the first electrode.

The plurality of semiconductor light emitting devices are connected in parallel to the first wiring 1120 and the second wiring 1140, and thus the first electrode 1191 and the second electrode 1192 may be connected in parallel to the plurality of semiconductor light emitting devices. In detail, each of the light emitting modules 1100 includes a polygonal wiring board 1010, and the plurality of semiconductor light emitting devices are connected in parallel on the wiring board 1010.

In this instance, the light emitting modules 1100 include a first light emitting module 1103 and a second light emitting module 1104 neighboring to each other. The first electrode 1191 arranged on one side of the first light emitting module 1103 may face the second electrode 1192 arranged on one side of the second light emitting module 1104. The light emitting modules 1100 are disposed to be connected in series to the neighboring light emitting modules in a manner that the first electrode 1191 and the second electrode 1192 overlap each other.

As such, since one of the electric anode or cathode is disposed on each side of the light emitting module and the electric anode or cathode is disposed on a different surface, the light emitting modules may overlap each other at the edge so as to constitute a series-connection unit assembly.

The wiring board 1110 may have three sides, and the light emitting modules 1100 may be arranged such that a triangle and an inverted triangle are repeated along one direction. For the triangular light emitting module 1100, the first electrode 1191 is disposed on at least one of a first side, a second side and a third side and the second electrode 1192 is disposed on another one of the three sides. In this instance, as illustrated in this example, when the triangles and the inverted triangles are continuously arranged, an electrode of the triangular light emitting module 1100 and an electrode of the inverted-triangular light emitting module 1100 facing the triangular light emitting module has opposite polarities to each other. Accordingly, the triangular wiring board 1110a and the inverted-triangular wiring board 1110b may be connected in series.

As illustrated, the electrical connection of the first light emitting module 1103 and the second light emitting module 1104 may be implemented by a conductive connection portion 1170 which is made of a conductive material and is arranged between the electrodes facing each other.

The conductive connection portion 1170 may be made of a conductive material, and arranged on an overlapped portion between the first wiring 1120 of the light emitting module and the second wiring 1140 of the neighboring light emitting module.

In detail, the conductive connection portion 1170 may be disposed between two adjacent light source modules in the sub light source unit SL. In this instance, the conductive connection portion 1170 is disposed between the first electrode 1191 of the first light emitting module 1103 and the second electrode 1192 of the second light emitting module 1104. The conductive connection portion 1170 may be coupled to the second electrode 1192 after being arranged on the first electrode 1191 through a process such as printing, deposition, plating, soldering or the like. As an example, the conductive connection portion 1170 may be made of a solder material.

As aforementioned, the sub light emitting units SL form a series-connection unit assembly by the serially-connected light emitting modules 1100. The sub light emitting units SL may be connected in parallel on one surface of the base portion 1010. To this end, a wiring may be provided on the one surface of the base portion 1010. In this example, four of the light emitting modules 1100 are arranged along one direction to form a parallelogram. The four light emitting modules 1100 are connected in series to form one sub light emitting unit SL. In this instance, the four light emitting modules 1100 may be arranged in the one direction in a manner that a right light emitting module covers (overlaps) an edge of a left light emitting module. In this instance, the light emitting modules may generate a height difference in the one direction, but it is not a problem in a light source using a micro-unit semiconductor light emitting device.

In addition, as illustrated in FIG. 5B, the right light emitting module overlapping the edge of the left light emitting module has a displacement at an end portion thereof. For example, since substrates are flexible, even though the substrates are connected by the conductive connection portions 1170, a upper substrate between the substrates is bent downwardly, which may result in further reduction of the height difference.

In addition, each of the sub light source units SL is arranged along another direction intersecting with the one direction, thereby forming one light source unit. Thus, a light emitting surface of a large area can be realized with a high degree of design freedom.

According to the structure of the light source unit of the present invention described above, the light source modules may overlap one another at the edges and be electrically connected, thereby constituting a series-connection unit assembly.

Further, the series-connection unit assembly may be arranged in parallel so that a large surface light source in desired size and shape can be realized. Through such a serial-parallel mixed structure, the light source modules can be tiled to match a design.

Meanwhile, the series-connection unit assembly may be varied into various forms. Hereinafter, such variations will be described.

Figure 7:
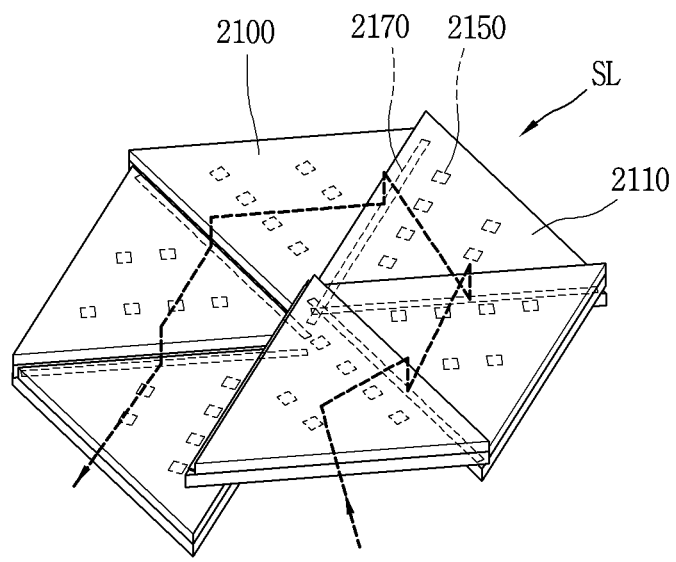
FIGS. 7 and 8 are conceptual views illustrating embodiments of a series-connection unit assembly according to the present invention.
Figure 8:
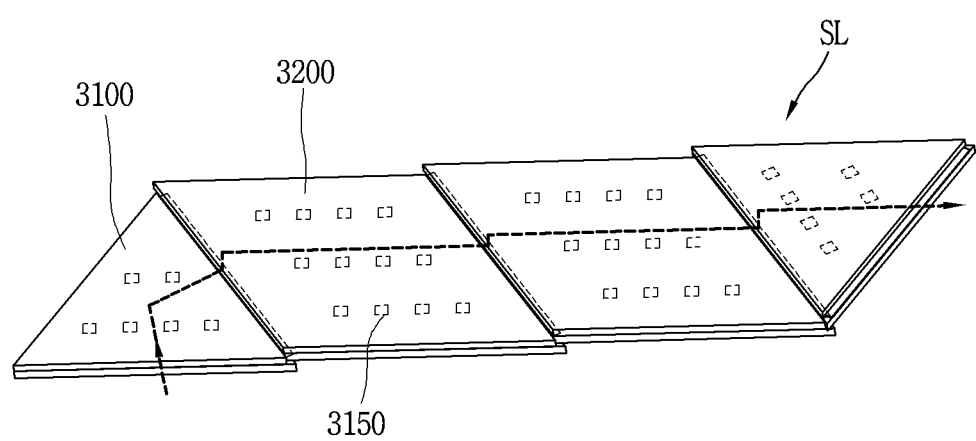

FIGS. 7 and 8 are conceptual views illustrating embodiments of a series-connection unit assembly according to the present invention.

Referring to FIG. 7, six light source modules 2100 may be connected in series to form one sub light source unit SL.

The plurality of light source modules 2100 may be formed in a triangular shape and continuously attached on a surface of a base portion (not illustrated). Three triangular unit light source modules may be arranged in two rows for each row.

In this instance, the light emitting modules 2100 may be arranged to overlap each other in a thickness direction in a manner that at least one side (first side) included in the light emitting modules 2100 faces one side (second side) of a neighboring light emitting module.

For example, the light source modules 2100 may be arranged so that triangles and inverted triangles are repeated in each row and column. More specifically, a triangle and an inverted triangle are arranged in order along a clockwise direction, and a hexagonal sub light source unit SL can be formed accordingly.

In this instance, each of the light source modules 2100, similar to the example described with reference to FIGS. 2 to 6, includes a wiring board 2110, a first wiring (not illustrated), an adhesive layer (not illustrated), a second wiring (not illustrated), an insulating layer (not illustrated) and a plurality of semiconductor light emitting devices 2150. The structure of the wiring board, the first wiring, the adhesive layer, the second wiring, the insulating layer and the plurality of semiconductor light emitting devices is the same as the structure of the above-described example, and thus description thereof will be omitted.

Meanwhile, a portion of the first wiring without being covered with the insulating layer forms a first electrode 2191. Of a surface electrode of the second wiring, a portion arranged on an edge of the wiring board may be defined as a second electrode 2192.

As illustrated, the plurality of electrodes are arranged on sides facing each other in an overlapping manner such that the light emitting modules 2100 are electrically connected together. For example, one of the first electrode (not illustrated) or the second electrode (not illustrated) may be arranged on each side included in the light emitting modules 2100, and the first electrode and the second electrode may be connected to the p-type electrodes and the n-type electrodes of the plurality of semiconductor light emitting devices, respectively.

In more detail, the first electrode connected to the p-type electrodes of the plurality of semiconductor light emitting devices and the second electrode connected to the n-type electrodes are sequentially arranged one by one on the sides of the light emitting module along the clockwise direction. In this instance, since six of the same light emitting module are arranged to form the triangles and the inverted triangles in the clockwise direction, the first electrode 2191 of one of the two neighboring light emitting modules may overlap the second electrode 2192 of the other.

The overlapped electrodes are connected in series by the conductive connection portion 2170. The conductive connection portion 2170 may be located between the overlapped first and second electrodes. The conductive connection portion may be formed through a process such as printing, deposition, plating or the like.

As such, as the sides of each light emitting module are sequentially stacked along the clockwise direction, the light emitting modules can be connected in series to constitute the series-connection unit assembly in a hexagonal shape.

Meanwhile, as another example, referring to FIG. 8, light emitting modules 3100 and 3200 connected in series may have a plurality of shapes. As an example, the light emitting modules 3100 and 3200 may include a first light emitting module 3100 in a triangular shape and a second light emitting module 3200 in a parallelogram shape.

For example, the first light emitting modules 3100 may be arranged on edges of the sub light emitting unit SL and the second light emitting modules 3200 may be arranged within the sub light emitting unit. In this instance, each of the light emitting module 3100 and the second light emitting module 3200, as similar to the example described with reference to FIGS. 2 to 6, includes a wiring substrate 3110, a first wiring (not illustrated), a second wiring (not illustrated), a second wiring (not illustrated), an insulating layer (not illustrated), and a plurality of semiconductor light emitting elements 3150. The structure of the wiring board, the first wiring, the adhesive layer, the second wiring, the insulating layer, and the plurality of semiconductor light emitting elements is the same as that of the above-described example, and the description thereof will be omitted.

In addition, the second light source module 3200 is formed in a manner that two of the light source modules of the example described with reference to FIGS. 2 to 6 are combined into one parallelogram. Since the second light source module 3200 in the parallelogram shape is arranged inside the sub light source unit SL, the number of light source modules can be reduced. On the other hand, since the triangular first light source modules 3100 are disposed at the edges of the sub light source unit, a degree of freedom for design of the light source unit can be maintained.

Also, the second light source module in the parallelogram shape may have a first electrode disposed on one of a left side and a right side, and a second electrode disposed on the other side. Since the first light source modules 3100 in the triangular shape are arranged in the form of a triangle and an inverted triangle on both sides of the second light source module, the left side and the right side of the second light source module can be electrically connected to the electrodes of the first light emitting modules in an overlapping manner.

As described above, according to the present invention, neighboring light source modules can be stacked so that the electric anode and cathode are in contact with each other at the edges of the light source modules, thereby realizing the serial connection of the light source modules even without a base board. Thus, the light source modules can be assembled to constitute a sub light source unit even without a bezel.

In a vehicle lamp according to the present invention, a surface light source in desired size and shape can be implemented by use of light source modules. Also, a triangular light source module can be configured to improve a degree of freedom for design of a light emission shape of the vehicle lamp.

According to the present invention, electric anode and cathode can be patterned on both surfaces of the wiring board, respectively, such that a p-type electrode and an n-type electrode of the semiconductor light emitting device can be electrically isolated from each other on an upper surface of the wiring board. Also, neighboring light emitting modules may be stacked such that electric anode and cathode are brought into contact each other at edges of the light emitting modules, which may result in implementing a series connection (or serial connection) of the light emitting modules even without a base board. Accordingly, the light source modules can be assembled to constitute a sub light source unit even without a bezel, and additionally a large surface light source of a zero bezel can be implemented without a base board. In addition, this structure can be implemented by a simplified fabrication process, thereby obtaining advantages in cost and process complexity.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A vehicle lamp comprising a plurality of light emitting modules electrically connected together,
    wherein each of the light emitting modules comprises:
        a wiring board;
        a plurality of semiconductor light emitting devices arranged on one surface of the wiring board;
        an insulating layer filled between neighboring semiconductor light emitting devices;
        a first wiring electrically connected to first conductive electrodes of the semiconductor light emitting devices and arranged on the one surface of the wiring board; and
        a second wiring electrically connected to second conductive electrodes of the semiconductor light emitting devices,
        wherein the first wiring of at least one of the light emitting modules and the second wiring of a neighboring light emitting module overlap each other in a thickness direction of the light emitting modules, such that the light emitting modules are connected in series,
        wherein each insulating layer is formed to partially cover the respective first wiring such that at least part of the respective first wiring is externally exposed at an edge of the respective light emitting module,
        wherein each second wiring is located on the respective insulating layer and extends from the respective insulating layer to the one surface of the respective wiring board, and
        wherein the second wiring further extends to another surface of the respective wiring board through a via hole.

2. The vehicle lamp of claim 1, wherein the first wiring of the at least one of the light emitting modules overlaps the second wiring of the neighboring light emitting module at edges of the light emitting modules.

3. The vehicle lamp of claim 2, wherein the light emitting modules are arranged such that the edges are sequentially stacked in one direction.

4. The vehicle lamp of claim 1, wherein at least a first side included in the light emitting modules overlaps a second side of the neighboring light emitting module.

5. The vehicle lamp of claim 4, wherein the at least first side included in the light emitting modules is arranged to face the second side of the neighboring light emitting module.

6. The vehicle lamp of claim 1, wherein the first wiring is connected to p-type electrodes of the plurality of semiconductor light emitting devices, and the second wiring is connected to n-type electrodes of the plurality of semiconductor light emitting devices.

7. The vehicle lamp of claim 6, wherein the first wiring and the second wiring form common electrodes, respectively, and
    wherein the plurality of semiconductor light emitting devices are connected in parallel to the first wiring and the second wiring to have the first wiring and the second wiring as the common electrodes, respectively.

8. The vehicle lamp of claim 1, wherein the wiring board of each of the light emitting modules is a polygonal wiring board, and
    wherein the plurality of semiconductor light emitting devices are connected in parallel on the respective wiring board.

9. The vehicle lamp of claim 8, wherein each wiring board has three sides, and
    wherein the light emitting modules are arranged such that triangles and inverted triangles are repeated along one direction.

10. The vehicle lamp of claim 1, further comprising a conductive connection portion made of a conductive material, and disposed on an overlapped portion between the first wiring of the at least one light emitting module and the second wiring of the neighboring light emitting module.

11. The vehicle lamp of claim 1, wherein at least one of the first wiring and the second wiring has a surface electrode.

12. The vehicle lamp of claim 11, wherein a first surface electrode is formed on the one surface of each wiring board, and a second surface electrode is formed on another surface of the respective wiring board.

13. The vehicle lamp of claim 12, wherein the first surface electrode is provided with a wiring through hole corresponding to the via hole.

14. The vehicle lamp of claim 1, wherein the light emitting modules are connected in series to form a sub light emitting unit, and
wherein the sub light emitting unit is one of a plurality of sub light emitting units connected in parallel.

* * * * *